(12) United States Patent
Dunsmore

(10) Patent No.: US 7,088,087 B2
(45) Date of Patent: Aug. 8, 2006

(54) NETWORK ANALYZER INCLUDING AUTOMATIC PORT EXTENSION CALIBRATION AND METHOD OF OPERATION

(75) Inventor: Joel Dunsmore, Sebastopol, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/939,670

(22) Filed: Sep. 13, 2004

(65) Prior Publication Data

US 2006/0055394 A1   Mar. 16, 2006

(51) Int. Cl.
*G01D 18/00* (2006.01)

(52) U.S. Cl. .................. 324/76.19; 702/85; 702/106

(58) Field of Classification Search ............ 324/76.19; 702/85, 106
See application file for complete search history.

(56) References Cited

U.S. PATENT DOCUMENTS

| 5,399,976 | A  | * | 3/1995  | Wardle ..................... 324/621 |
| 5,578,932 | A  | * | 11/1996 | Adamian ................... 324/601 |
| 6,300,775 | B1 | * | 10/2001 | Peach et al. ............... 324/601 |
| 6,836,743 | B1 | * | 12/2004 | Blackham et al. .......... 702/107 |
| 6,882,160 | B1 | * | 4/2005  | Martens et al. ............ 324/601 |
| 6,920,407 | B1 | * | 7/2005  | Adamian et al. ........... 702/104 |
| 6,928,373 | B1 | * | 8/2005  | Martens et al. ............. 702/65 |

* cited by examiner

*Primary Examiner*—Diane Lee
*Assistant Examiner*—Marina Kramskaya

(57) ABSTRACT

In one embodiment, a method of automatically calibrating a network analyzer for measuring devices under test (DUTs) using a test fixture comprises generating a stimulus signal on a respective port that is coupled to the test fixture; measuring reflection of the stimulus signal on the respective port to generate measurement data, wherein the measurement data reflects a phase response of the test fixture; processing the measurement data to compensate for ripples generated by impedance mismatch at a coupling associated with the network analyzer and the test fixture; and adjusting a port extension setting of the network analyzer according to the processing.

20 Claims, 4 Drawing Sheets

NETWORK ANALYZER INCLUDING AUTOMATIC PORT EXTENSION CALIBRATION AND METHOD OF OPERATION

TECHNICAL FIELD

The present application is generally related to calibrating network analyzers to perform measurements using text fixtures.

BACKGROUND OF THE INVENTION

Network analyzers are devices that are used to determine the radio frequency (RF) characteristics of various devices under test (DUTs). In many situations, a DUT is a relatively small component designed to interface with a trace contact point on a printed circuit board (PCB). Many network analyzers typically utilize an interface adapted to receive a coaxial coupling. To test a DUT designed to be employed on a PCB using such a network analyzer, a test fixture is often employed. A test fixture is generally a specialized device that is adapted to readily accept a DUT and that electrically couples the DUT to one or several ports of a network analyzer.

For many DUTs (such as balanced filters, baluns, balanced amplifiers, etc.), the pertinent performance measurements depend upon both the magnitude and phase of the signals applied to and received at each port. In the case of balanced devices, it is quite important that the phase of delay of each test fixture port be identical between the balanced pairs of ports. However, the use of network analyzers and test fixtures to perform such measurements presents difficulties. Specifically, it is common to experience different path lengths on different ports using test fixture/network analyzer configurations. The variations may result from PCB layout constraints, manufacturing process limitations, and/or other reasons.

"Port Extensions" for network analyzers have been developed that attempt to address the difference in path length between ports of a network analyzer. A port extension provides a mathematical delay to the results measured on a respective port. The mathematical delay models the linear portion of the phase response that results from the differences in electric length of a test step-up.

Specifically, port extension functionality typically operates by defining a respective delay value for each port. After measurements are made, the network analyzer applies phase compensation to the measurement data using the defined delay values depending upon the ports involved. For example, when reflection measurements are made, twice the delay defined for a given port is used to compensate for the delay in the incident signal and the reflected signal. For transmission measurements, the delay of the incident port and the delay of the response port are used to compensate for the delay of the electrical path between the two different ports. Each phase compensation value for the various frequencies of the frequency span is then calculated by multiplying the total delay by the respective frequency of the phase compensation value. Accordingly, by suitably applying the phase compensation values, the data provided by the network analyzer compensates for the delay introduced by the test fixture.

SUMMARY

Although known network analyzers provide a number of advantageous characteristics, known network analyzers possess limitations. In particular, known network analyzers require users to determine the appropriate values to be applied via port extensions. Accordingly, the calibration of a network analyzer to conduct testing using a test fixture can be time consuming and is subject to a degree of inaccuracy.

Some representative embodiments are directed to systems and methods for automatically calibrating a network analyzer to conduct measurement operations using a test fixture. Specifically, S11 measurements of a known reflection are made from which phase references can be generated. "S11 measurements" refer to measurements made by a network analyzer using a scattering parameter model where "S11" refers to the ratio of a reflected signal to an incident signal on the same port. The known reflection may result from an open circuit (e.g., omitting the DUT from the test fixture) and/or a short circuit. Processing of the measurement data may be performed to account for errors in the phase response that result from poor source/PCB match of the test set-up. The processing enables a greater degree of accuracy in the calculation of the delay presented by the various port connections to the test fixture.

DETAILED DESCRIPTION

In some representative embodiments, a stimulus signal is successively provided to multiple ports of a network analyzer and reflection measurements are made on each of the multiple ports. The reflection measurements are used to estimate the delay associated with the test fixture through each port. Additionally, the coaxial-to-PCB connection of the test fixtures frequently exhibits relatively poor impedance matching. A poor impedance match will result in significant ripples when the open standard is used to obtain the reflection measurements. Also, coupler/bridge directivity may introduce ripples in reflection measurements. Accordingly, some representative embodiments estimate the delay associated with multiple ports of a network analyzer coupled to a test fixture by suitably processing phase response values associated with multiple frequencies.

Figure 1:
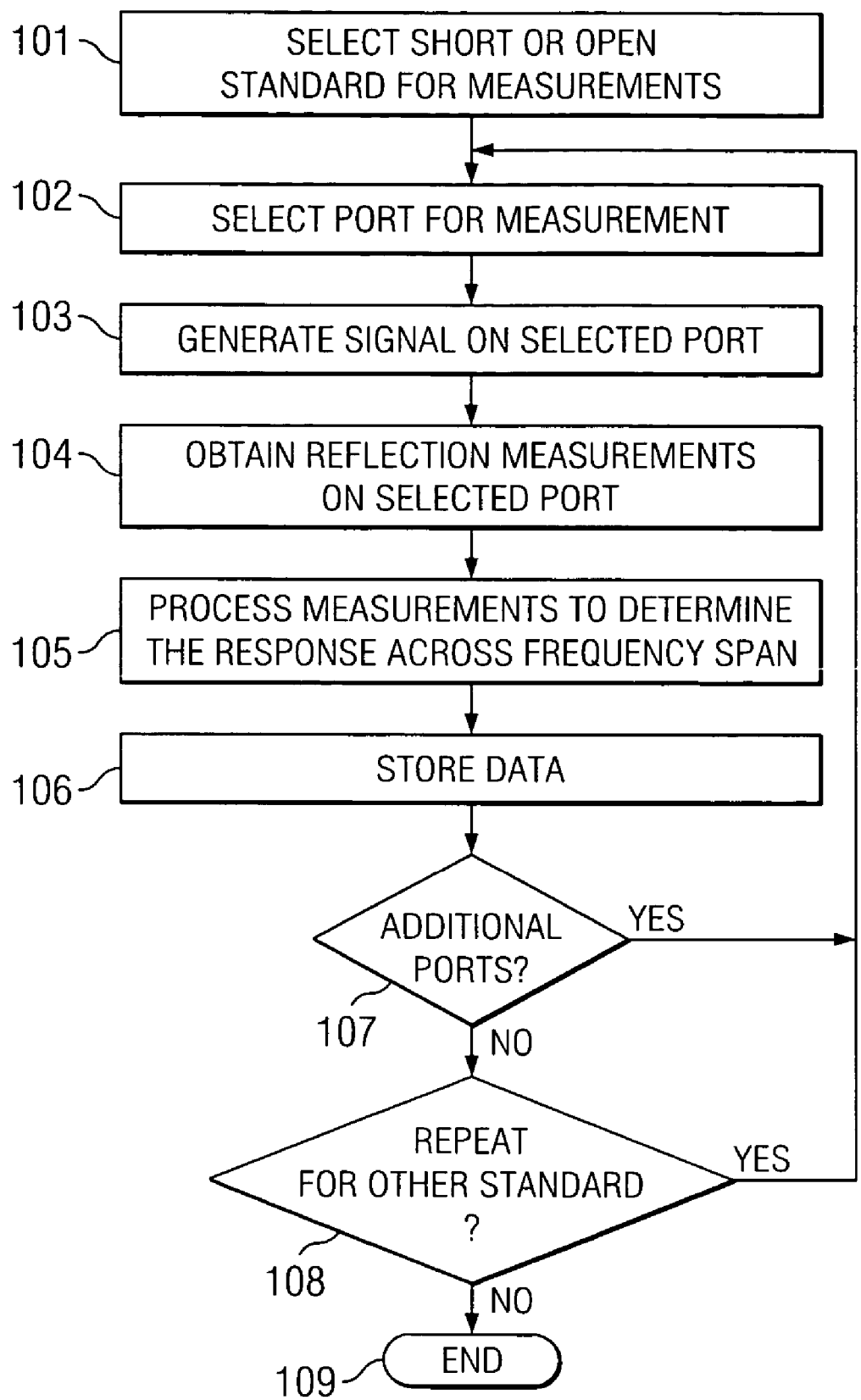
FIG. 1 depicts a flowchart according to one representative embodiment.

Referring now to the drawings, FIG. 1 depicts a flowchart for operation of a network analyzer according to one representative embodiment. In one representative embodiment, the flowchart is implemented using suitable software instructions or code executed by a processor of the network analyzer. In other embodiments, integrated circuitry may be alternatively or additionally employed to implement a portion of or the entire flowchart.

In step 101, a short standard or an open standard is selected for subsequent measurements. The short standard refers to an ideal electrical connection having unity reflection with 180 degrees of phase shift. Measurements under the short standard typically obtain the response of the test fixture set-up when a suitable test kit component is inserted within the test fixture. The open standard refers to an unterminated transmission line. The open standard is measured by omitting placement of any element within the test fixture and, hence, the circuit path is "open." The selection of the standard may occur by receiving suitable input from the user of a network analyzer through a graphical user interface (GUI) or other interface. Any other suitable reflection standard can be used if the phase versus frequency response of the standard can be known or assumed.

In step 102, a port of the network analyzer is selected for calibration. In one representative embodiment, a suitable software loop selects a respective port by iteratively stepping through each port available on the device. Alternatively, the user may manually select the port through a GUI or other interface.

In step 103, a signal is generated on the selected port. In step 104, reflection measurements are made on the selected port. In step 105, the measurements are processed to determine the response across a frequency span. The processing may include vector error correction. It is common to perform a vector error correction at the coaxial port before the test fixture is connected. In this way, only the error of the test fixture itself enters into the measurement. In step 106, the response data is stored for subsequent processing.

In step 107, a logical comparison is made to determine whether there are additional ports to be tested. If so, the process flow returns to step 102. In step 108, a logical comparison is made to determine whether to repeat the process for the other standard. If the logical comparison is true, the process flow returns to step 109 to perform the process using the other standard. In step 109, the measurement process ends.

Figure 2:
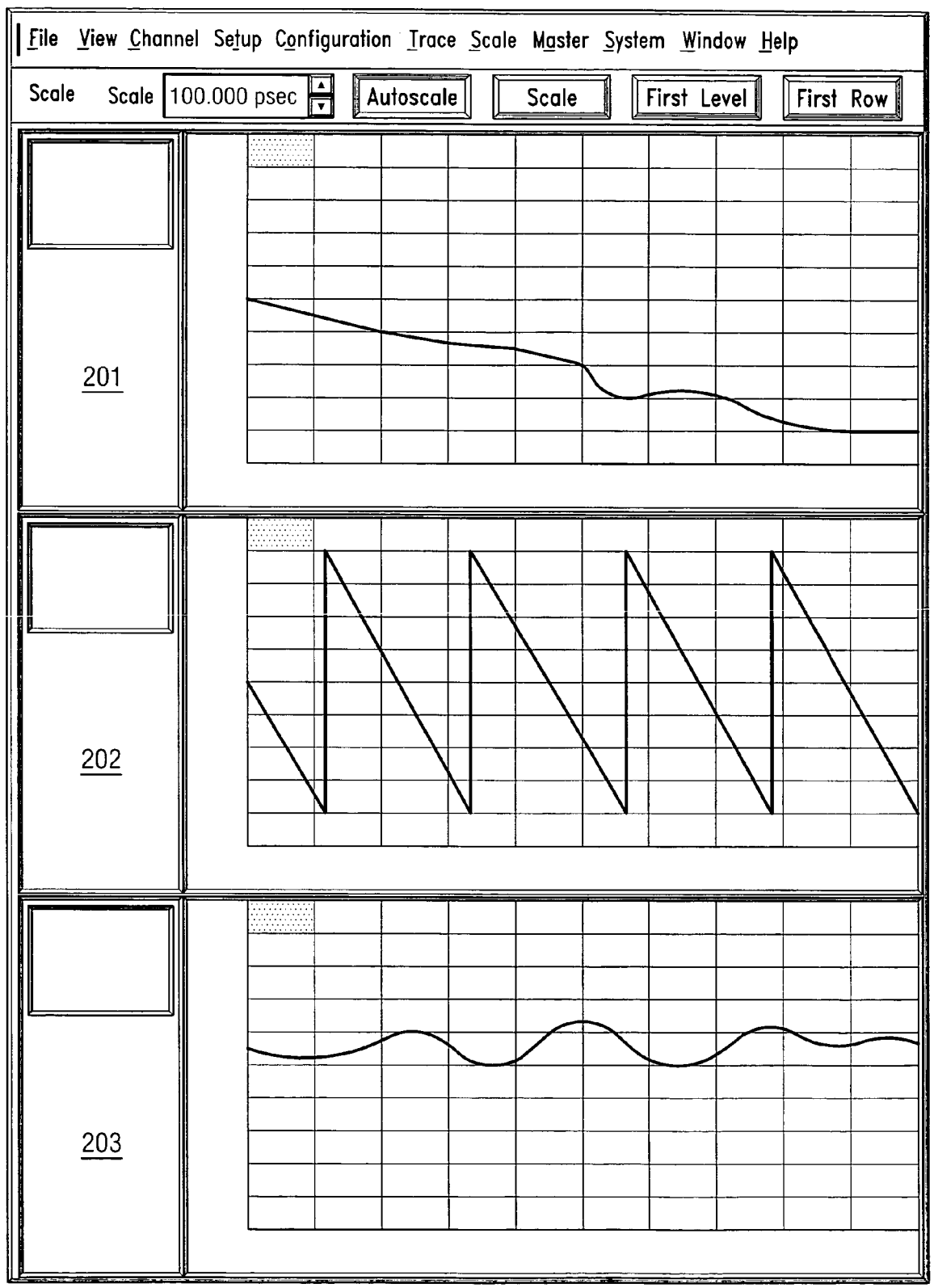
FIG. 2 depicts an amplitude response, a wrapped phase response (limited to the range of $-\pi$ to $+\pi$ radians), and a delay response of a test fixture using the open standard according to one representative embodiment.

FIG. 2 depicts amplitude response 201, phase response 202, and delay response 203 associated with reflection measurements of a test fixture using the open standard according to one representative embodiment. The responses associated with the open standard may be used as a directed normalization of the correct trace when testing of DUTs occurs. However, as seen in FIG. 2, responses 201–203 exhibit ripple. The ripples in responses 201–203 are indicative of errors caused by the poor source match (the coaxial-to-PCB connection) of the measurement system and the open response. As previously discussed, port extension functionality selects a single delay value to control application of phase compensation to measurement data. However, because delay response 203 exhibits ripples, it is not immediately evident which value across the frequency span of delay response 203 would be appropriate to characterize the respective port. Also, a common manual method to extract delay is to leave the port open, view the phase response, and apply various port extension values until the trace if flat. This method is time consuming, subject to interpretation, and requires a skilled operator. In addition, ripple in the measurement can obscure the correct interpretation of the result.

It is possible to appreciably mitigate the source match contribution by employing an average of the open standard and the short standard. The average responses of the open and short standard can then be applied as a normalization to measurements of DUTs using the test fixture. However, in some test situations, it is not readily practical to perform measurements using the short standard and only open standard measurements are applied. Some representative embodiments process the measurement data obtained from the open standard to mitigate the errors generated by the poor source match of the test system.

In one representative embodiment, the average of the group delay values associated with multiple frequencies across a frequency span is used to address the errors associated with the poor source match of the test system. In another embodiment, a line fitting algorithm is applied to unwrapped phase values to address the errors associated with the poor source match of the test system.

In practice, the values of the averaging method and the linear fitting method will frequently generate approximately the same result. However, the mathematics associated with the averaging operation is susceptible to corruption of the phase values associated with the first and last frequencies of a frequency span. The group delay for a respective frequency in a frequency span is calculated using the difference in phase values associated with frequencies adjacent to the respective frequency. Specifically, a respective group delay value may be expressed as follows: $gd_i = -(\phi_i - \phi_{i+1})/(f_i - f_{i+1})$. The average group delay is then: $1/N \Sigma\, gd_i$ for i=1 to N. The term $f_i - f_{i+1}$ is typically constant ($\Delta f$) across the frequency span and may be moved outside of the summation thereby giving the average group delay as: $-1/N\, \Delta f\, \Sigma\, (\phi_i - \phi_{i+1})$ for i=1 to N. Accordingly, the intermediate phase values simply cancel and only the first and last phase values contribute to the average group delay across the frequency span. For example, the summation includes $-\phi_2$ for i=1 and $\phi_2$ for i=2. Thus, only the first and last phase values ($\phi_1 - \phi_{N+1}$) remain after the summation is completed. If the first or last phase value is corrupted (e.g., by noise), the average group delay value will be corrupted.

Figure 3:
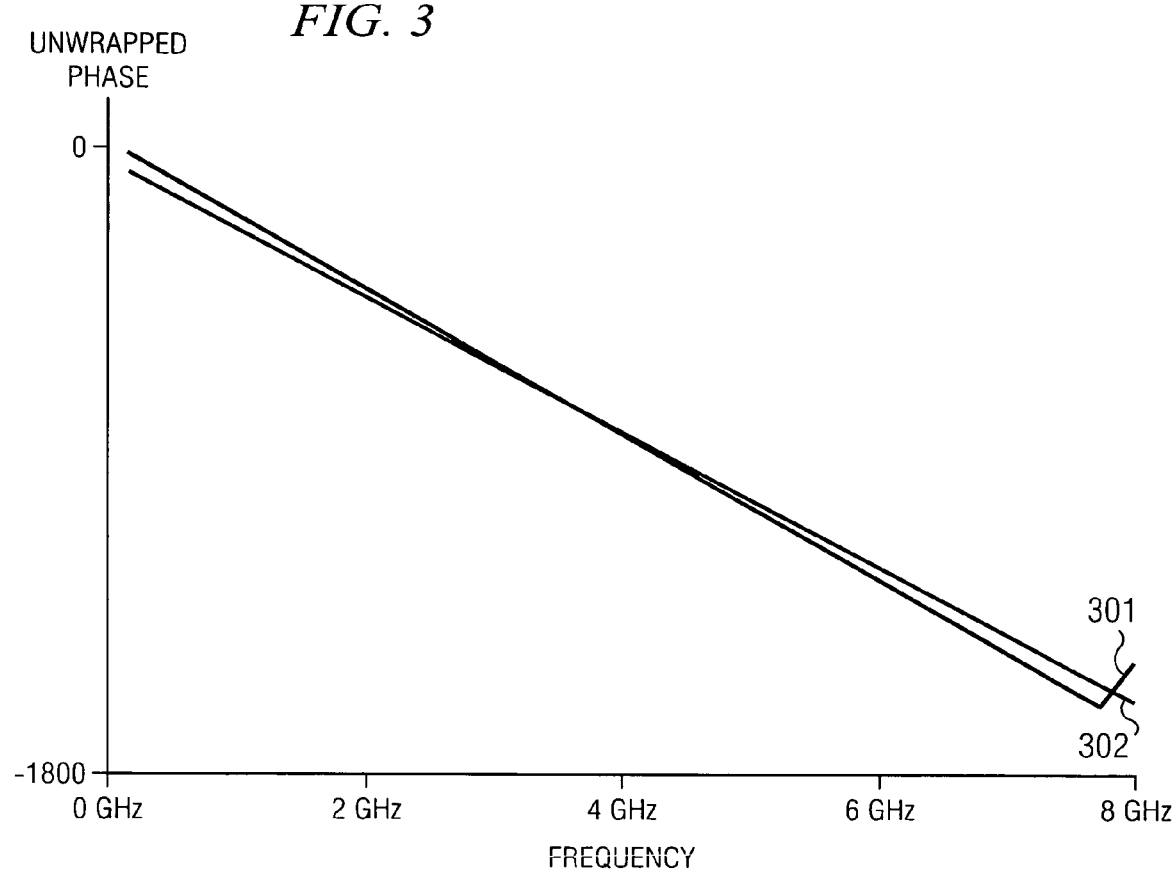
FIG. 3 depicts a line fitted to unwrapped phase data (the absolute value of the phase is allowed to be greater than $\pi$ radians) according to one representative embodiment.

Wrapped phase values are seen in phase response 202 of FIG. 2. The wrapped phase values are constrained to values between $-\pi$ and $\pi$. Because the wrapped phase values are constrained to this range, fitting a line to the wrapped values will not typically produce an accurate estimate of the delay associated with a respective port. Unwrapped phase values may be calculated by detecting an absolute phase change of $\pi$ or greater and adding or subtracting $2\pi$ depending upon the value of the phase change. Unwrapped phase values are depicted in FIG. 3 which are not constrained to values between $-\pi$ and $\pi$. The use of unwrapped phase values enables a line fitting algorithm to accurately estimate the delay of the test fixture set-up.

FIG. 3 depicts graph 300 that includes unwrapped phase data and a linear fit to the unwrapped phase data. As seen in graph 300, point 301 suffers from corruption due to noise or some other effect. Although the least squares method is used to fit a line to the unwrapped phase data in one embodiment, any suitable line fitting method may be employed. As seen in FIG. 3, the termination of the fitted line does not suffer from corruption at point 302 due to the corruption of point 301 of the underlying phase data.

Accordingly, in one representative embodiment, the delay is calculated from the fitted line and, hence, is less susceptible to noise or other signal corruption. Specifically, group delay is the measure of the slope of the phase response. Because the fitted line is used to model the linear portion of the phase response, the slope of the fitted line is preferably used to calculate the delay value for the port extension. As previously discussed, port extension functionality applies zero phase compensation at DC. However, when a fitting algorithm is employed, a non-zero Y-intercept point (a non-zero value at DC) will likely be produced. The non-zero Y-intercept will result in a phase that is offset from a delay-based phase (which has a zero Y-intercept). In one embodiment, the delay is compensated for the non-zero Y-intercept by adding an offset delay with a value that gives the phase offset at one half of the frequency span. Thus, using the slope of the fitted line and the appropriate phase offset according to one embodiment, the phase response has zero compensation at the lowest frequency, one-half the Y-intercept at the midpoint, and twice the Y-intercept at the highest frequency.

Figure 4:
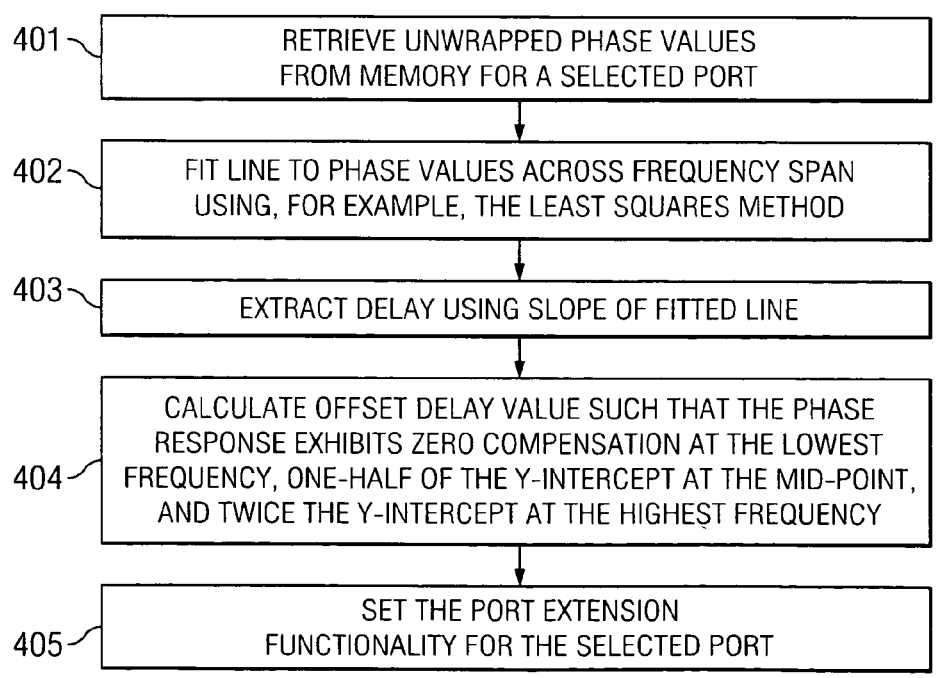
FIG. 4 depicts another flowchart according to one representative embodiment.

FIG. 4 depicts a flowchart for processing data to calibrate port extension functionality according to one representative embodiment. In one representative embodiment, the flowchart is implemented using suitable software instructions or code executed by a processor of the network analyzer. In other embodiments, integrated circuitry may be alternatively or additionally employed to implement a portion of the flowchart or the entire flowchart.

In step 401, unwrapped phase values are retrieved from memory for a port to be calibrated. In step 402, a line is fitted to the phase values across a frequency span using, for example, the least squares method. In step 403, the delay is extracted using the slope of the fitted line. In step 404, an offset delay is calculated such that the phase response exhibits zero compensation at the lowest frequency, one-half of the Y-intercept at the mid-point, and twice the Y-intercept at the highest frequency. In step 405, the port extension functionality of the selected port is then suitably set to the appropriate setting. Because initial measurements were made using reflection measurements, the unwrapped phase values are indicative of twice the delay presented by the text fixture on the respective port. Accordingly, a division by two is preferably performed during the delay calculation process to properly account for the delay of the port.

Figure 5:
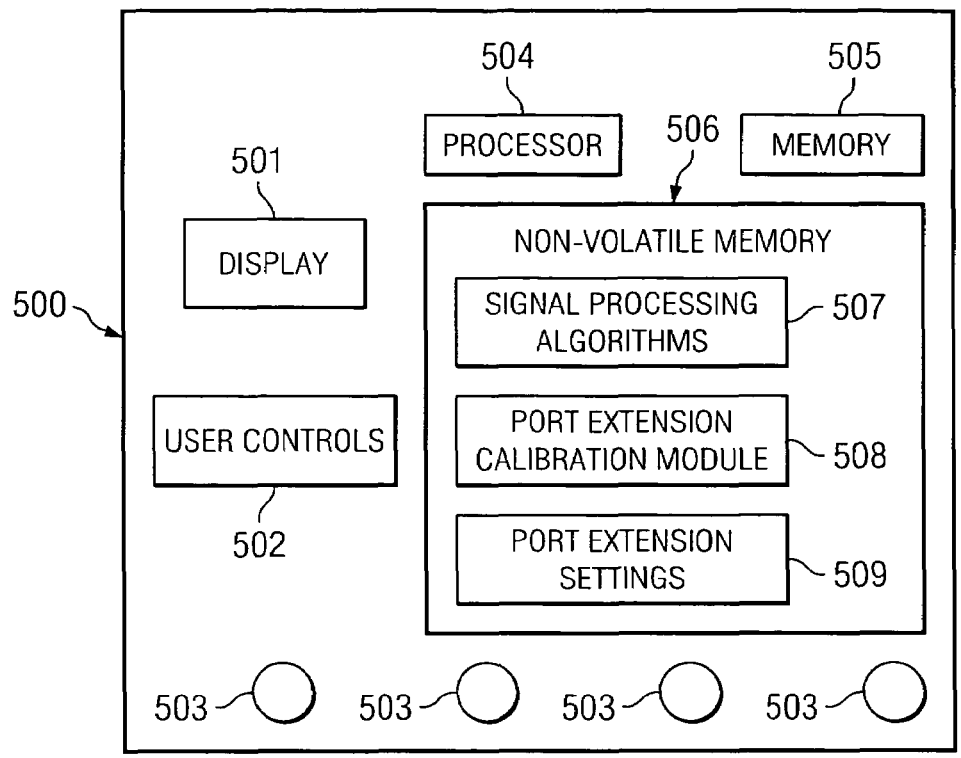
FIG. 5 depicts a network analyzer according to one representative embodiment.

FIG. 5 depicts a block diagram of network analyzer 500 according to one representative embodiment. Network analyzer 500 includes typical elements common to network analyzers. For example, network analyzer 500 includes processor 504 to control the operations of network analyzer 500. Network analyzer 500 further includes memory 505 to store measurement data for processing. Network analyzer 500 includes display 501 for presenting measurement data, user interfaces, and/or the like and user controls 502 to enable user control over the operations of network analyzer 500. Network analyzer 500 includes multiple coaxial or other ports 503 to generate signals for application to a DUT and to receive signals from a DUT during test operations.

Network analyzer 500 preferably includes logic (software instructions, integrated circuitry, and/or the like) for performing automatic calibration of port extension functionality. For example, as shown in FIG. 5, non-volatile memory 506 is used to store software instructions or code that define the operations of network analyzer 500. Non-volatile memory 506 includes signal processing algorithms 507 that perform typical spectral analysis of measurement data. Signal processing algorithms 507 includes port extension functionality to address differences in electrical lengths between a test fixture and ports 503. Non-volatile memory 506 further includes port extension calibration module 508 that measures reflection signals from ports 503 and calculates port extension settings 509 after processing of the measurement data.

The extraction of the phase response to determine the appropriate port extension calibration has assumed that the point spacing is sufficiently dense that there is less than 180 degrees between measurement points. A search can be performed where data point density is increased (using interpolated error correction during the measurement if required), the delay gain can be recalculated, and the recalculated delay can be compared to the delay at the lower point density. If the delay remains substantially the same, then the points are not aliased. If the delays are substantially different, the method of increasing data point density is repeated until the delay remains substantially the same. Extracting the delay in this manner may appreciably minimize the effect of a poor fixture/source match, and ensure that a proper delay is determined for electrically long fixtures, without requiring interpretation by the user.

Figure 6:
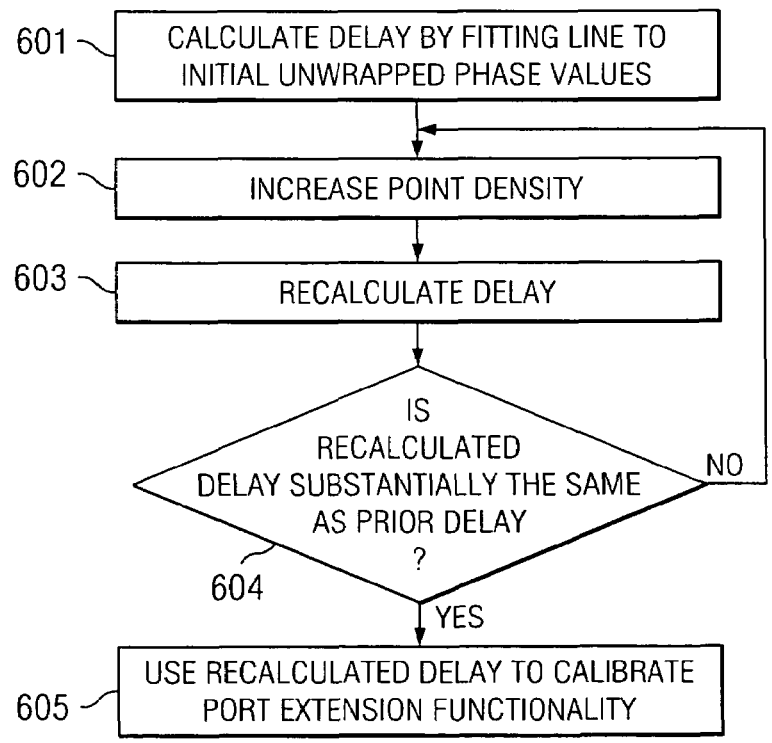
FIG. 6 depicts a flowchart for processing data to calibrate port extension functionality according to one representative embodiment.

FIG. 6 depicts a flowchart for processing data to automatically extract a port extension value according to one representative embodiment. In one representative embodiment, the flowchart is implemented using suitable software instructions or code (such as port extension calibration module 508 of FIG. 5) executed by a processor of the network analyzer. In other embodiments, integrated circuitry may be alternatively or additionally employed to implement a portion of the flowchart or the entire flowchart.

In step 601, a port extension value for a port is calculated by fitting a line to the initial unwrapped phase values. In step 602, the point density is increased. In step 603, the delay for the port is recalculated by fitting a line to the unwrapped phase values associated with the increased point density. In step 604, a logical comparison is made to determine whether the recalculated delay is substantially the same as the prior delay. If not, the process flow returns to step 602 to again increase the point density and recalculate the delay. If the recalculated delay is substantially the same, the process flow proceeds to step 605 where the recalculated delay is used to calibrate the port extension functionality.

If the network analyzer sweep is using segmented sweep, where the point density in each segment may not be the same, and the segments may not be evenly distributed, (with each segment having sufficient point density), the delay of the individual segments is determined using the unwrapped phase for each segment. A first and last phase point for each segment is determined. The first and last frequencies are applied to the extracted delay for the segment giving a segment delta phase and a segment delta frequency. The overall delay is determined by calculating the sum of the delta phases and dividing by the sum of all the delta frequencies.

By calibrating port extension functionality, some representative embodiments enable network analyzer measurements to be made more accurately and in a more efficient manner. Multiple manual calibration operations need not necessarily occur. Measurements using multiple standards for calibration of the port extension functionality need not necessarily occur. Moreover, suitable processing of measurement data enables a relatively accurate estimate of the delay presented by a test fixture to be determined despite ripples in response data due to poor source matching characteristics.

What is claimed is:

1. A method of automatically calibrating a network analyzer for measuring devices under test (DUTs) using a test fixture, comprising:

generating a stimulus signal on a respective port that is coupled to said test fixture;

measuring reflection of said stimulus signal on said respective port to generate measurement data, wherein said measurement data reflects a phase response of said test fixture;

processing said measurement data to compensate for ripples generated by impedance mismatch at a coupling associated with said network analyzer and said test fixture; and adjusting a port extension setting of said network analyzer according to said processing.

2. The method of claim 1 where the reflection is a short standard.

3. The method of claim 1 where the reflection is an open standard.

4. The method of claim 1 further comprising:
applying a vector error correction to said reflection measurement.

5. The method of claim 1 wherein said processing comprises averaging said measurement data with measurement data obtained from reflection measurements associated with multiple standards.

6. The method of claim 1 wherein said processing comprises calculating an average group delay value across a frequency span.

7. The method of claim 1 wherein said processing comprises fitting a line to phase values obtained from said measurement data.

8. The method of claim 7 further comprising:
determining a delay value from a slope of said fitted line.

9. The method of claim 8 further comprising:
determining an offset value from said delay value, wherein said adjusting said port extension setting applies said offset value such that zero compensation is provided at a lowest frequency, compensation of one-half of a Y-intercept value of said fitted line is applied at a mid-point frequency, and compensation of twice said Y-intercept value is applied at a highest frequency.

10. The method of claim 1 further comprising:
unwrapping said phase response before performing said processing.

11. A method of automatically calibrating a network analyzer for measuring devices under test (DUTs) using a test fixture, comprising:
measuring reflection of a stimulus signal on a respective port of said network analyzer to generate measurement data, wherein said measurement data reflects a phase response of said test fixture according to an open standard;
repetitively calculating delay values associated with said test fixture by fitting a line to said measurement data until a current delay value is substantially the same as a prior delay value, wherein said repetitively calculating is performed in conjunction with successively increasing point density associated said measurement data; and
adjusting a port extension setting of said network analyzer using one of said calculated delay values.

12. The method of claim 11 wherein said repetitively calculating comprises:
determining a slope of a respective line fitted to measurement data.

13. The method of claim 11 further comprising:
determining an offset value from said delay value, wherein said adjusting said port extension setting applies said offset value such that zero compensation is provided at a lowest frequency, compensation of one-half of a Y-intercept value of said fitted line is applied at a mid-point frequency, and compensation of twice said Y-intercept value is applied at a highest frequency.

14. The method of claim 11 wherein said repetitively calculating employs a least square method to fit a line to measurement data.

15. The method of claim 11 further comprising:
unwrapping phase response values before performing said repetitively calculating.

16. A network analyzer, comprising:
a plurality of ports for application of stimulus signals to a device under test (DUT) and for measuring signals from said DUT;
signal processing logic for performing spectral analysis of measurements made on said plurality of ports, wherein said signal processing logic applies port extension compensation to phase data generated by said spectral analysis;
logic for processing reflection measurement data, during a calibration mode of said network analyzer, to generate estimates of delay from said plurality of ports to a test fixture used to hold DUTs; and
logic for adjusting port extension settings in response to said logic for processing.

17. The network analyzer of claim 16 wherein said logic for processing reflection measurement data averages measurement data obtained using multiple standards.

18. The network analyzer of claim 16 wherein said logic for processing reflection measurement data performs a line fitting operation to generate said estimates of delay.

19. The network analyzer of claim 18 wherein said line fitting operation uses a least square method to determine a slope and Y-intercept of a line fitted to measurement data.

20. The network analyzer of claim 18 wherein said logic for processing is operable to repetitively calculate delay values associated with said test fixture until a current delay value is substantially the same as a prior delay value while concurrently increasing point density associated said measurement data.

* * * * *